United States Patent [19]

Besson

[11] Patent Number: 5,459,431
[45] Date of Patent: Oct. 17, 1995

[54] FREQUENCY/PHASE ANALOG DETECTOR AND ITS USE IN A PHASE-LOCKED LOOP

[75] Inventor: Yves Besson, Paris, France

[73] Assignee: Thomson-CSF, Paris, France

[21] Appl. No.: 176,485

[22] Filed: Apr. 6, 1988

[30] Foreign Application Priority Data

Apr. 30, 1987 [FR] France ................................ 87 06172

[51] Int. Cl.⁶ ............................. G01R 29/26; G01S 9/02
[52] U.S. Cl. ............................................. 329/306; 331/11
[58] Field of Search ................................ 329/137, 135; 331/11

[56] References Cited

U.S. PATENT DOCUMENTS 3,927,405  12/1975  Poinsard et al. ............................. 342/1
3,996,588  12/1976  Besson et al. ............................ 331/11

FOREIGN PATENT DOCUMENTS 2451584  11/1980  France .
2051864   7/1985  Germany .
 951642   8/1982  U.S.S.R. .
1246357   7/1986  U.S.S.R. .

*Primary Examiner*—Nelson Moskowitz
*Attorney, Agent, or Firm*—Pollock, Vande Sande & Priddy

[57] ABSTRACT

A frequency/phase detector for a reference signal with a fixed frequency and a second signal with a variable frequency comprises essentially a frequency discriminator, already known, in which the output signal of a frequency-dependent phase-shifting circuit centered on said fixed frequency is applied, not directly to a demodulator circuit but through a summing circuit that receives in addition said reference signal.

3 Claims, 1 Drawing Sheet

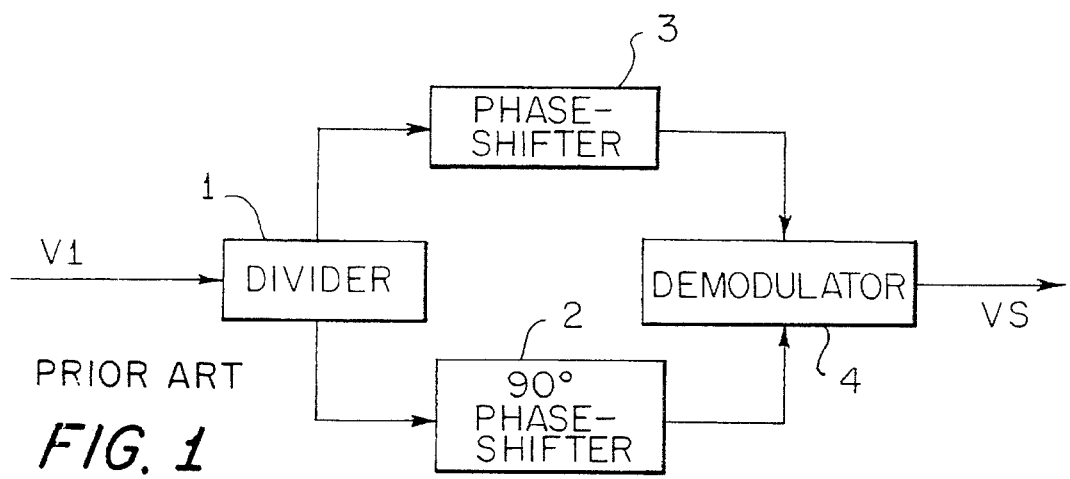
FIG. 1 PRIOR ART
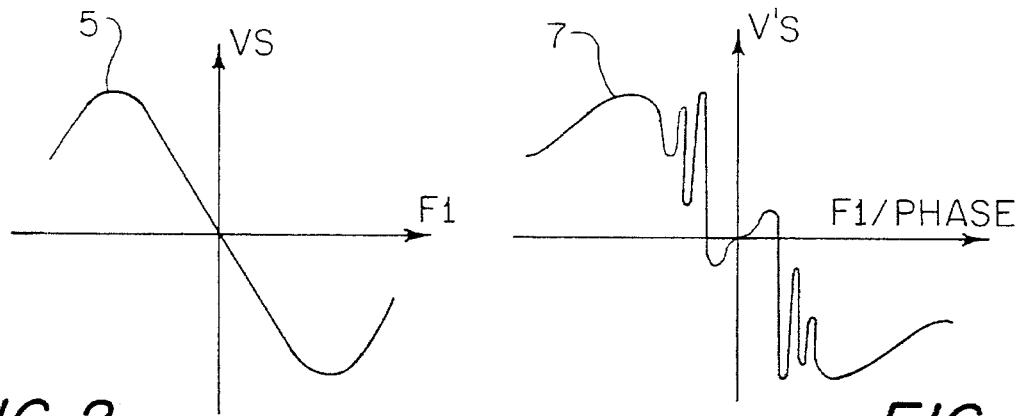
FIG. 2
FIG. 4
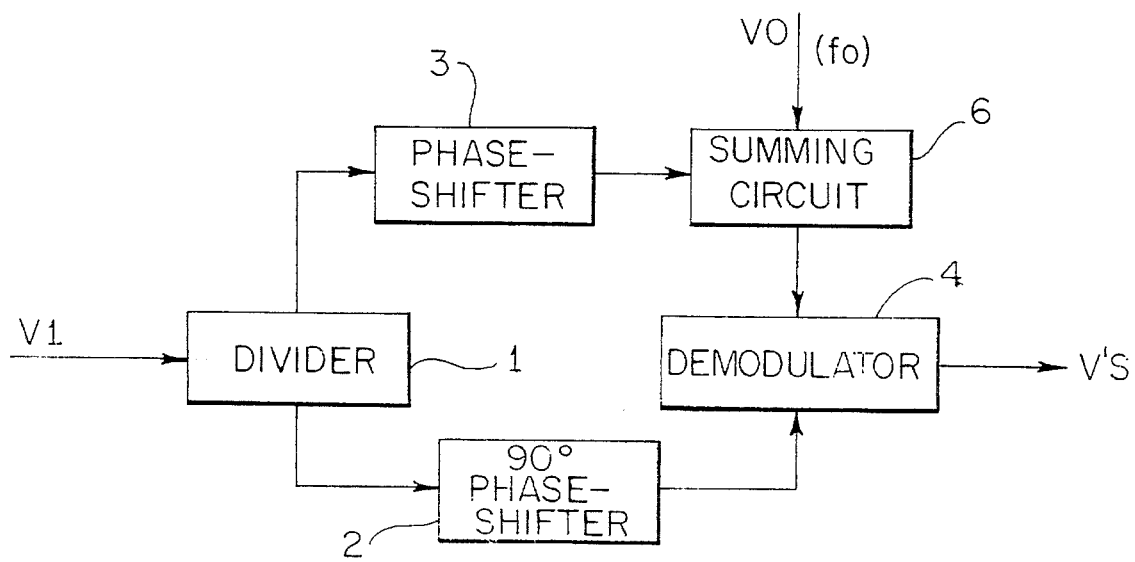
FIG. 3

FREQUENCY/PHASE ANALOG DETECTOR AND ITS USE IN A PHASE-LOCKED LOOP

BACKGROUND OF THE INVENTION

1. Field of the Invention

The present invention relates to a detector of the analog type that is usable in the field of circuits for generating electrical signals at predetermined frequencies, for example in radars and frequency synthesizers.

2. Description of the Prior Art

A phase detector is used for comparing the phase of a first electrical signal, delivered for example by a variable-frequency oscillator, with that of a second electrical signal called "reference signal", furnished for example by a fixed-frequency oscillator, so as to obtain an electrical signal whose amplitude is characteristic of the phase difference according to a known law. This difference signal is then used to modify the frequency and, therefore, the phase of the first signal, for example by applying it to the control input of the variable-frequency oscillator. This arrangement constitutes a loop for phase-locking the first signal to the second signal.

This phase lock operates only if the phase difference is less than 360°, i.e., when both signals have the same frequency, which in general is not the case at turn-on. This results in the necessity of combining the phase lock with an adjustment to the frequency of the phase detector.

The present invention relates to a frequency/phase detector of the analog type that is usable in a phase-locked loop in the field of circuits for generating electrical signals with predetermined frequencies, for example in radars and communications and more particularly in the frequency synthesizers using phase-locked loops.

A phase detector is used for comparing the relative phase between the electrical signal from, for example, a first variable-frequency oscillator and that of a second electrical signal called "reference signal" furnished, for example, by a fixed-frequency oscillator.

When used in a phase-locked loop, this device uses the output signal of the phase detector, suitably amplified, to control the frequency of the variable oscillator.

The whole device includes in its operation two well-known stages:

1. a frequency-homing stage when the oscillators are at different frequencies;

2. a phase-locking stage in which the oscillators are kept at the same frequency by using the error voltage that is a function of the phase difference between these oscillators to control the variable-frequency oscillator.

In certain situations, the frequency-homing range is reduced and generally limited by the bandwidth of the phase-locked loop, this when a simple phase detector without auxiliary aid is used.

To perform this frequency homing, several solutions have been proposed. For example, it has been proposed to associate with the variable-frequency oscillator a frequency-search device whose effect is inhibited when the lock of the phase-locked loop is achieved. Such a solution has the major disadvantage to require a relatively long search time. Another solution consists in associating a frequency detector and a phase detector whose output signals are summed at video frequency; in this case, however, the signal of the frequency detector can introduce noise in the signal of the phase detector, which entails the risk of degrading the performance of the latter.

There have also been proposed digital devices which have the dual behaviour of a frequency detector when they receive signals with very different frequencies and that of a phase detector when they receive signals with the same frequency. Such devices have been described, for example, in the French patent application N° 86 06860 filed on May 13, 1986 by the applicant. However, these devices have currently the major disadvantage of operating in a frequency band of a few tens of megahertz only.

SUMMARY OF THE INVENTION

An object of the present invention is consequently to build a frequency/phase detector of the analog type that does not have the above-mentioned disadvantages of the prior art devices.

Another object of the present invention is to build a frequency/phase detector of the analog type that operates in a wide frequency band, including microwave frequencies.

According to the present invention, an analog frequency/phase detector for a first reference electrical signal with a fixed frequency F0 and a second electrical signal with a variable frequency F1 comprises, in a known manner, a divider circuit to which is applied the second signal, a 90°-phase-shifting circuit to which is applied a portion of the second signal from the divider circuit, a phase-shifting circuit producing a frequency-dependent phase shift, to which is applied the remaining part of the second signal. The output signal of the 90°-phase-shifter is applied to an input of a phase demodulator circuit, the other input receiving the output electrical signal of a summing circuit. The latter receives at a first input the signal from the frequency-dependent phase-shifting circuit and at a second input the reference first signal with a fixed frequency F0.

The demodulator circuit delivers then a signal whose amplitude depends on the frequency difference (F1–F0) when this difference exists and on the phase difference when both signals have the same frequency F0.

The frequency-dependent phase-shifting circuit is centered on the frequency F0.

BRIEF DESCRIPTION OF THE DRAWINGS

Other features and advantages of the present invention will become apparent from the following detailed description of an embodiment given as an example with reference to the accompanying drawings, in which FIG. 1 is a block diagram of a frequency detector of known principle of operation;

FIG. 2 is a diagram that shows the shape of the curve of the output voltage VS of the frequency detector of FIG. 1 as a function of frequency;

FIG. 3 is a block diagram of a frequency/phase detector according to the present invention, and FIG. 4 is a diagram that shows the shape of the curve of the output voltage V'S as a function of the frequency of the frequency/phase detector according to the present invention.

A frequency detector of the prior art can be illustrated by the block diagram of FIG. 1. This detector comprises a divider circuit 1 that receives at its input an electrical signal V1 with a variable frequency F1 and that delivers at its two outputs two signals V'1 and V"1 with the same frequency F1. The signal V'1 is applied to a phase-shifting circuit 2 introducing a 90°-phase-shift. The signal V"1 is applied to a circuit 3 that introduces a phase shift that depends on the frequency F1. More precisely, the circuit 3 is, for example, a resonant circuit tuned to a frequency F0 that corresponds to the center frequency of the frequency variation range of the signal V"1. When this resonant circuit is excited by a signal with a frequency different From F0, the phase of the signal that appears at its output varies as a function of the frequency difference existing with respect to F0, but its frequency remains equal to F1. The output signals of the circuits 2 and 3 are applied to a phase demodulator circuit 4 that produces an output signal VS whose amplitude is a measure of the frequency difference that exists between F1 and F0.

The shape of the curve 5 of the amplitude of the signal VS as a function of the frequency F1 is illustrated by the diagram in FIG. 2.

DESCRIPTION OF A PREFERRED EMBODIMENT

To construct a frequency/phase detector according to the present invention, it is proposed to modify the block diagram of FIG. 1 to introduce a summing circuit 6 (FIG. 3) that receives at a first input the output signal of the circuit 3 and, at a second input, a reference signal V0 with a fixed frequency F0. This summing circuit 6 gives an output signal V2 that is applied to the demodulator circuit 4. The output signal V'S of the demodulator circuit 4 is a measure both of the difference between the frequencies F1 and F0 and of the phase difference between the signals VO and V1 at the frequency F0.

The curve 7 of the diagram of FIG. 4 illustrates the variation of the amplitude of the output signal V'S as a function of frequency. In fact, it is the curve 5 of FIG. 2 with regard to the mean value, but with oscillations about this mean value. These oscillations correspond to the signal V2 that results from the vector addition of a signal with a frequency F1 and a signal VO with the frequency F0, i.e., the signal V2 is the beat frequency F1–F0. This beat frequency is relatively high at the ends of the response curve and decreases as F1 comes closer to F0. When the detector that has just been described is used in a phase-locked loop for the signals V1 and VO, it first operates as a frequency detector so as to bring the signal V1 to the frequency F0, then as a phase detector to lock the phase of V1 to that of VO. It is this mode of operation that has led to presenting this device as a frequency/phase detector.

The various elements constituting the frequency/phase detector according to the present invention are well known by those skilled in the art and will consequently not be described in more detail here.

What is claimed is:

1. An analog frequency/phase detector for a first reference electrical signal with a first fixed frequency and a second electrical signal with a variable frequency, that includes a divider circuit to which is applied said second signal, a 90°-phase-shifting circuit to which is applied a portion of said second signal from said divider circuit, a frequency-dependent phase-shifting circuit to which is applied the remaining portion of said second signal, and a demodulator circuit to which is applied the output signal of said 90° phase-shifting circuit, and further including a summing circuit to which are applied said first reference electrical signal and said output signal of said frequency-dependent phase-shifting circuit, said summing circuit delivering a signal that is applied to said demodulator circuit.

2. A frequency/phase detector according to claim 1, wherein said frequency-dependent phase-shifting circuit is centered on the frequency of said reference first electrical signal.

3. A phase-locked loop using a frequency/phase detector according to claim 1.

* * * * *